United States Patent
Pu et al.

(10) Patent No.: US 10,650,768 B2
(45) Date of Patent: May 12, 2020

(54) SHIFT REGISTER UNIT AND DRIVING METHOD THEREOF, GATE DRIVING CIRCUIT AND DISPLAY PANEL

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Xun Pu, Beijing (CN); Xin Bi, Beijing (CN); Zhongshan Wu, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 181 days.

(21) Appl. No.: 16/033,175

(22) Filed: Jul. 11, 2018

(65) Prior Publication Data
US 2019/0122625 A1 Apr. 25, 2019

(30) Foreign Application Priority Data

Oct. 19, 2017 (CN) .......................... 2017 1 0979544

(51) Int. Cl.
G11C 19/00 (2006.01)
G09G 3/36 (2006.01)
G11C 19/28 (2006.01)
G11C 7/02 (2006.01)

(52) U.S. Cl.
CPC ........... *G09G 3/3677* (2013.01); *G11C 19/28* (2013.01); *G09G 2310/0286* (2013.01); *G09G 2310/061* (2013.01); *G09G 2310/08* (2013.01); *G11C 7/02* (2013.01)

(58) Field of Classification Search
None
See application file for complete search history.

(56) References Cited

U.S. PATENT DOCUMENTS

| 8,019,039 B1 * | 9/2011 | Tsai | G11C 19/28 377/64 |
| 10,068,658 B2 | 9/2018 | Wang | |
| 2009/0121998 A1 * | 5/2009 | Ohkawa | G09G 3/3688 345/100 |
| 2009/0128726 A1 | 5/2009 | Tanno | |

(Continued)

FOREIGN PATENT DOCUMENTS

| CN | 101673526 A | 3/2010 |
| CN | 104715733 A | 6/2015 |

(Continued)

OTHER PUBLICATIONS

First Chinese Office Action dated Jul. 24, 2019, received for corresponding Chinese Application No. 201710979544.0.

*Primary Examiner* — Tuan T Lam
(74) *Attorney, Agent, or Firm* — Kinney & Lange, P.A.

(57) ABSTRACT

A shift register unit and a driving method thereof, a gate driving circuit and a display panel are disclosed. In the shift register unit of the embodiments of the present disclosure, at least two transistors are configured to be coupled to a DC signal supplying terminal. The at least two transistors are controlled to be alternatively turned on by an inputting signal from the DC signal supplying terminal.

12 Claims, 7 Drawing Sheets

(56) References Cited

U.S. PATENT DOCUMENTS

| | | | |
|---|---|---|---|
| 2011/0187976 A1 | 8/2011 | Tanno | |
| 2014/0055334 A1* | 2/2014 | Qing | G09G 3/3611 |
| | | | 345/100 |
| 2015/0206597 A1* | 7/2015 | Liao | G11C 19/28 |
| | | | 377/70 |
| 2017/0092376 A1 | 3/2017 | Wang | |
| 2018/0174545 A1* | 6/2018 | Li | G09G 3/3648 |
| 2018/0226038 A1* | 8/2018 | Li | G09G 3/3677 |

FOREIGN PATENT DOCUMENTS

| CN | 10597883 A | 9/2016 |
|---|---|---|
| CN | 106023919 A | 10/2016 |

* cited by examiner

SHIFT REGISTER UNIT AND DRIVING METHOD THEREOF, GATE DRIVING CIRCUIT AND DISPLAY PANEL

CROSS-REFERENCE TO RELATED APPLICATION(S)

This application claims a priority of Chinese Patent Application No. 201810979544.0 filed on Oct. 19, 2017, the disclosure of which is incorporated herein by reference in its entirety as part of this application.

TECHNICAL FIELD

The present disclosure relates to a field of display technology, and in particular, to a shift register unit, a driving method thereof, a gate driving circuit, and a display panel.

BACKGROUND

In a thin film transistor display, a gate driving signal is usually provided to a gate of a respective thin film transistor (TFT) in a pixel area by a gate driving circuit. The gate driving circuit can be formed on an array substrate of a liquid crystal display by an arraying process, i.e., a Gate Driver on Array (GOA) process. This integration process can not only save the cost, but can also realize a design of a narrow frame.

The gate driving circuit generally comprises a plurality of cascaded shift registers, and sequentially scans the gate lines through shift registers in respective stages among the plurality of cascaded shift registers. However, the thin film transistor comprised in the shift register stays in an ON state for a long time under control of a DC inputting signal, and a shift for its threshold voltage is relatively significant. This leads to a decrease in the lifetime of the transistor, further causing a decrease in the lifetime of the entire shift register.

SUMMARY

Embodiments of the present disclosure may provide a shift register unit and a driving method thereof, a gate driving circuit and a display panel.

According to an aspect of the embodiments of the present disclosure, there is provided a shift register unit, comprising:

an inputting circuit, coupled to a cascade inputting terminal for receiving an inputting signal and a first node, and configured to pull-up or pull-down a voltage at the first node under a control of the inputting signal;

a first outputting circuit, coupled to a clock signal terminal for providing a clock signal and a second node, and configured to output the clock signal as a first outputting signal at a gate voltage outputting terminal under a control of the clock signal;

a reset controlling circuit, coupled to a third node and a first level supplying terminal for providing a first level signal, and configured to control an operation of a first resetting circuit;

the first resetting circuit, coupled to the second node, the gate voltage outputting terminal and the first level supplying terminal, and configured to reset a voltage at the second node and a voltage at the gate voltage outputting terminal under a control of the reset controlling circuit; and a pulling-up circuit comprising at least two transistors, wherein each of the at least two transistors is coupled to a DC signal inputting terminal for providing a DC signal, and wherein the at least two transistors are configured to be alternatively turned on under a control of the DC signal, so as to pull up the voltage at the second node.

For example, the pulling-up circuit comprises a first transistor and a second transistor, wherein the first transistor is an N-type transistor and the second transistor is a P-type transistor; wherein a gate of the first transistor and a gate of the second transistor are coupled to the DC signal inputting terminal; and wherein the first transistor has a first electrode coupled to a first electrode of the second transistor, and a second electrode coupled to a second electrode of the second transistor.

For another example, the reset controlling circuit comprises at least two transistors, wherein each of the at least two transistors is coupled to the DC signal inputting terminal, and the at least two transistors are configured to be alternatively turned on under the control of the DC signal.

For another example, the shift register unit further comprise a second outputting circuit, wherein the second outputting circuit is coupled to the pulling-up circuit and the first outputting circuit via the second node, and is further coupled to the clock signal terminal, and configured to output the clock signal to a cascade outputting terminal as a second outputting signal.

For another example, the second outputting circuit comprises a third transistor; wherein the third transistor has a gate coupled to the second node, a first electrode coupled to the clock signal terminal, and a second electrode coupled to the cascade outputting terminal.

For another example, the shift register unit further comprises a second resetting circuit, wherein the second resetting circuit is coupled to a first outputting terminal and the first level supplying terminal, and configured to reset the voltage at the gate voltage outputting terminal under the control of the clock signal.

For another example, the second resetting circuit comprises a fifth transistor, and wherein the first outputting circuit comprises a fourth transistor; wherein one of the fourth and fifth transistors is an N-type transistor and the other is a P-type transistor; wherein the fourth transistor has a gate coupled to the second node, a first electrode coupled to the clock signal terminal, and a second electrode coupled to the gate voltage outputting terminal; and wherein the fifth transistor has a gate coupled to the clock signal terminal, a first electrode coupled to the first level supplying terminal, and a second electrode coupled to the gate voltage outputting terminal.

According to another aspect of the embodiments of the present disclosure, there is provided a gate driving circuit comprising a plurality of cascaded shift register units of any one of the above embodiments, wherein:

a cascade inputting terminal of a shift register unit in a first stage is coupled to a frame starting signal terminal;

wherein the cascade inputting terminal of each of other shift register units other than the shift register unit in the first stage is coupled to a cascade outputting terminal of a shift register unit in its previous stage; and wherein the resetting terminal of each of other shift register units other than the shift register unit in a last stage is coupled to a cascade outputting terminal of the shift register unit in its subsequent stage.

According to still another aspect of the embodiments of the present disclosure, there is provided a method for driving the shift register unit of any one of the above embodiments, comprising: a pre-charging period; a high level outputting period; a low level outputting period; and a resetting period, wherein the at least two transistors coupled to the DC signal inputting terminal of the pulling-up circuit is turned on alternatively under the control of the DC signal from the DC signal inputting terminal, during the pre-charging period, the high level outputting period, the low level outputting period, and the resetting period.

For example, during the high level outputting period, the second node maintains at a high level due to the pulling-up circuit, and the clock signal is at a high level; the first outputting circuit outputs the first outputting signal of a high power to the gate voltage outputting terminal under the control of the clock signal; the second outputting circuit outputs the second outputting signal of a high power to the cascade outputting terminal under the control of the clock signal.

For another example, the periods other than the high level outputting period are continuous resetting periods; wherein in the continuous reset periods, the clock signal is at a low level, so as to enable the second resetting circuit to reset the voltage at the first outputting terminal continuously.

According to yet another aspect of the embodiments of the present disclosure, there is provided a display panel comprising the gate driving circuit of any one of the above embodiments.

DETAILED DESCRIPTION

Figure 1:
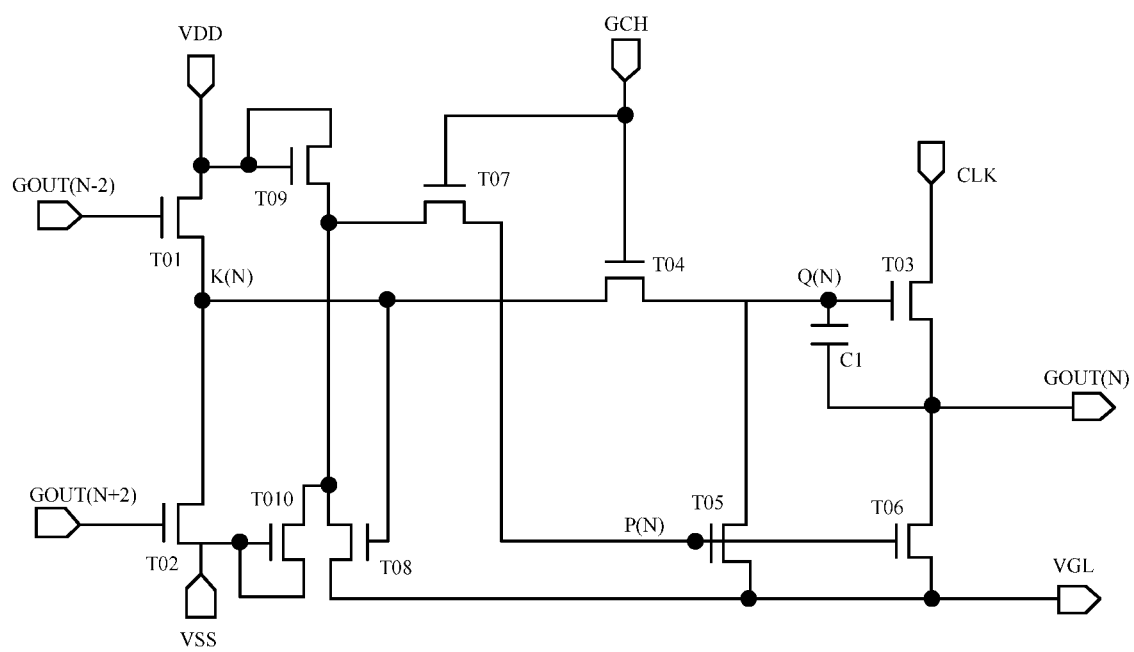
FIG. 1 shows a circuit diagram of a shift register unit.

In order to provide a better understanding of the above objects, features, and advantages of the present disclosure, the present disclosure will be further described in detail with reference to the accompanying drawings and specific embodiments.

In the description of the present disclosure, the expression such as "a plurality of" means two or more than two unless otherwise specified. Orientations or positional relationships indicated by the terms "upper", "lower", "left", "right", "inner", "outer" and the like are based on the orientations or positional relationships shown in the drawings. These orientations or positional relationships are merely for the convenience of describing the present disclosure and simplified descriptions, but are not intended to indicate or imply that the referred machine or element must have a specific orientation or be configured and operated with a specific orientation. Thus, they should not be construed as limiting the present disclosure.

In the description of the present disclosure, it should be noted that the terms "install", "couple to", and "connect with" should be understood in a broad sense, unless specifically defined or defined otherwise. It may be, for example, a fixed connection, a removable connection, or integrally connected; it may also be a mechanical connection or an electrical connection; or a direct connection or an indirect connection through an intermediary. For those skilled in the art, the meanings of the above terms in the present disclosure can be understood according to different situations.

The specific implementations of the present disclosure are further described in detail below with reference to the accompanying drawings and embodiments. The following examples are intended to illustrate the present disclosure but are not intended to limit the scope of the disclosure.

FIG. 1 shows a circuit diagram of a shift register unit. As shown in FIG. 1, T04 is a transistor coupled to a DC signal inputting terminal in the GOA unit. Since the transistor is always in an operating state, a drift of a threshold voltage Vth will be relatively significant, resulting in a large impact on the electrical performance. Thus, the lifetime of the transistor will be reduced significantly. This in turn results in reducing the lifetime of the entire shift register unit.

Figure 2:
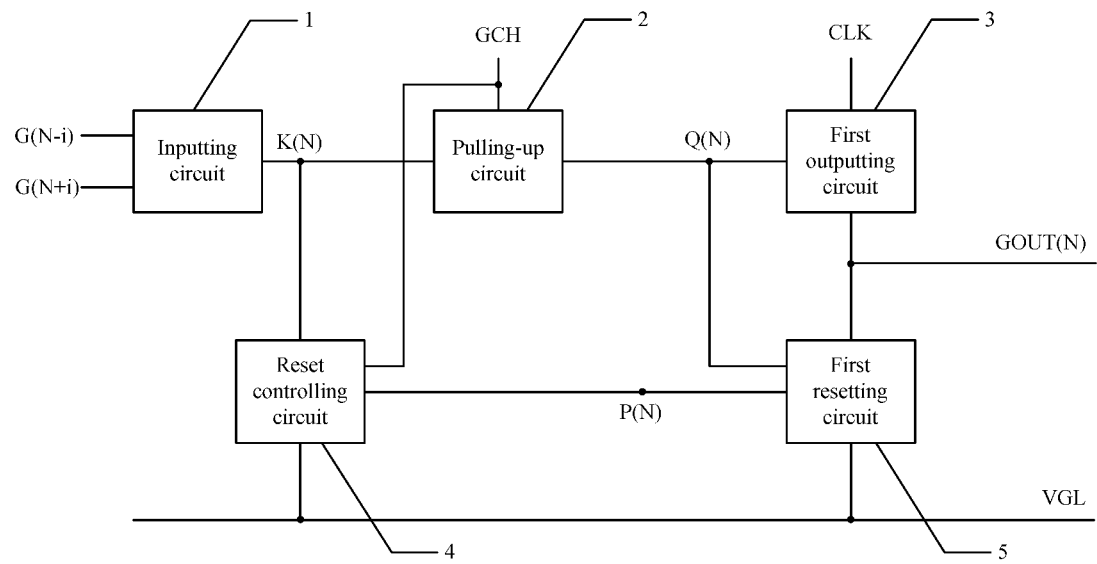
FIG. 2 shows a schematic structural diagram of a shift register unit according to an embodiment of the present disclosure.

FIG. 2 shows a schematic structural diagram of a shift register unit according to an embodiment of the present disclosure. The shift register unit comprises an inputting circuit 1, a pulling-up circuit 2, a first outputting circuit 3, a reset controlling circuit 4, and a first resetting circuit 5.

The inputting circuit 1 is coupled to a cascade inputting terminal for receiving an inputting signal, and connected to the pulling-up circuit and the reset controlling circuit 4 via a first node K(N). The inputting circuit 1 is configured to pull up or pull down a voltage at the first node K(N).

The first outputting circuit 3 is coupled to the pulling-up circuit 2 via a second node Q(N), and configured to output a clock signal as a first outputting signal at a gate voltage outputting terminal GOUT(N) under the control of the clock signal CLK.

The reset controlling circuit 4 is coupled to the first resetting circuit 5 via a third node P(N), and to a first level supplying terminal for providing a first level signal, such as a low level supplying terminal VGL. The reset controlling circuit 4 is configured to control an operation of the first resetting circuit 5

The first resetting circuit 5 is coupled to the second node Q(N), the gate voltage outputting terminal GOUT(N) and the low level supplying terminal VGL, and configured to reset the voltage at the second node Q(N) and the voltage at the gate voltage outputting terminal GOUT(N), under the control of the reset controlling circuit 4.

The pulling-up circuit 2 comprises at least two transistors, wherein each of the at least two transistors is respectively coupled to a DC signal inputting terminal GCH for providing a DC signal. The at least two transistors may be alternately turned on under the control of the DC signal, for pulling up the voltage at the second node Q(N).

Figure 3:
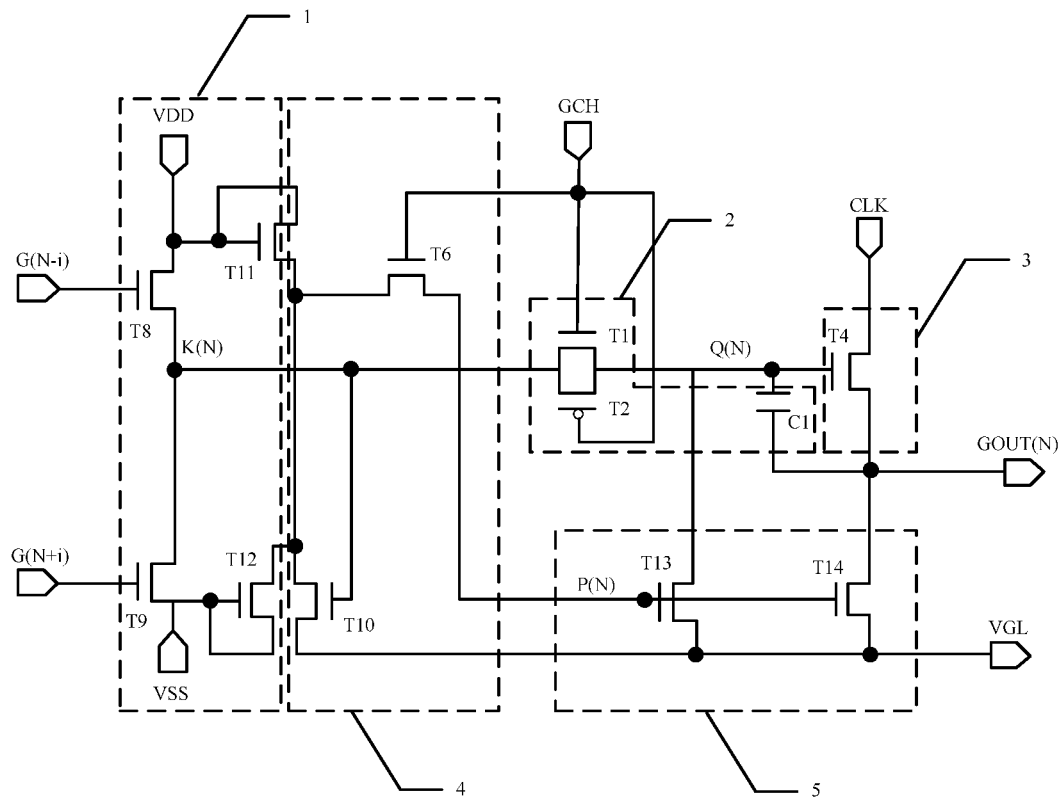
FIG. 3 shows a circuit diagram of the shift register unit according to the embodiment of the present disclosure.

Referring to FIG. 3, a circuit diagram of a shift register unit according to an embodiment of the present disclosure is shown. There are two transistors coupled to the DC signal inputting terminal GCH. That is, the pulling-up circuit 2 can include a first transistor T1 and a second transistor T2, where T1 may be an N-type transistor and T2 may be a P-type transistor. A gate of the first transistor T1 and a gate of the second transistor T2 are coupled to the DC signal inputting terminal GCH. The first transistor T1 has a first electrode coupled to a first electrode of the second transistor T2, and a second electrode coupled to a second electrode of the second transistor T2. By controlling the voltage of the inputting signal of the DC signal inputting terminal GCH, one of the transistors can be in an ON state and the other transistor can be in an OFF state, so that the two transistors T1 and T2 can be controlled to operate in a time-sharing manner. That is, when T1 is in the ON state, T2 is in the OFF state, and when T2 is in the ON state, T1 is in the OFF state. For example, when the GCH inputting signal is a high level signal, the first transistor T1 which is the N-type transistor is in the ON state and the second transistor T2 which is the P-type transistor is in the OFF state. When the GCH inputting signal is a low level signal, the first transistor T1 which is the N-type transistor is in the OFF state and the second transistor T2 which is the P-type transistor is in the ON state, thereby reducing the time for which each transistor stays in the ON state and reducing the duration of each turning-on. This can not only improve the lifetime of the transistors, but also can effectively avoid the threshold voltage drift caused by a long time operation of the transistors.

Actually, in a Low Temperature Poly-silicon (LTPS) type display panel, P-type and N-type Thin Film Transistors (TFTs) may exist at the same time. That is, P-type transistors and N-type transistors may exist at the same time. Therefore, embodiments of the present disclosure may be applied to a display panel based on LTPS technology.

Figure 4:
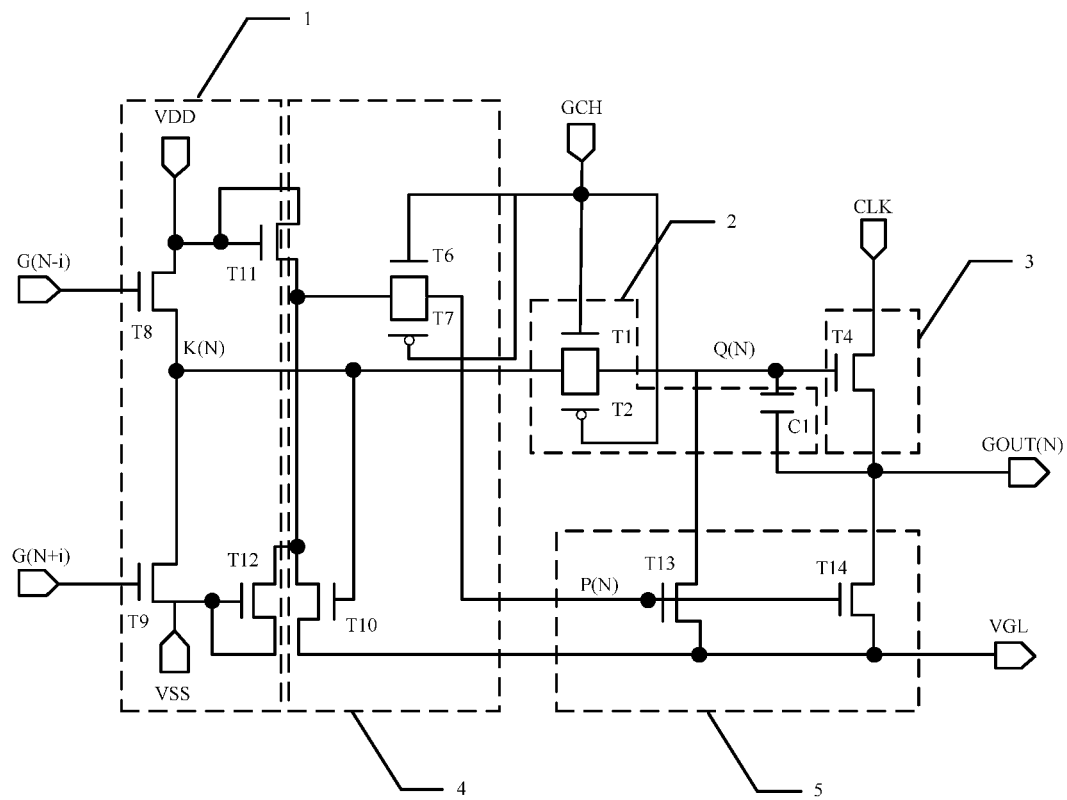
FIG. 4 shows a circuit diagram of another shift register unit according to an embodiment of the present disclosure.

Referring to FIG. 4, a circuit diagram of another shift register unit according to an embodiment of the present disclosure is shown. With reference to FIG. 4, the circuit according to the embodiment of the present disclosure is described in detail. It should be noted that the transistors used in the embodiments of the present disclosure may all be thin film transistors or field effect transistors or other devices with the same characteristics. In the embodiment of the present disclosure, the transistors used herein are mainly switching transistors, and the switching transistors may be P-type switching transistors or N-type switching transistors. For example, the first transistor, the third to the fourth transistors and the sixth to the eleventh transistors disclosed in the embodiment may be N-type switching transistors, which will be turned on when its corresponding gate is at a high level and turned off when the corresponding gate is at a low level. In the embodiment of the present disclosure, in order to distinguish the two electrodes except the gate of the transistor, one of the source and the drain of the transistor is referred to as a first electrode, and the other is referred to as a second electrode.

The inputting circuit 1 may comprise an eighth transistor T8 and a ninth transistor T9. The gate of T8 is coupled to the cascade outputting terminal G(N−i) of the GOA unit in a previous stage, and the gate of T9 is coupled to the cascade outputting terminal G(N+i) of the GOA unit in a next stage. The first electrode of T8 is coupled to the first constant voltage supplying terminal VDD, the second electrode of T8 is coupled to the first electrode of T9 through the first node K(N), and the second electrode of T9 is coupled to the second constant voltage supplying terminal VSS. In addition, the first electrode of T8 may also be coupled to a gate and a first electrode of a eleventh transistor T11 at the same time, so as to perform a noise reduction on T8 through T11. The second electrode of T9 may be also coupled to a gate and a second electrode of the twelfth transistor T12 at the same time, so as to perform a noise reduction on T9 through T12. If a forward scanning is performed, G(N−i) is used as a cascade inputting terminal of the GOA unit in the Nth stage, and G(N+i) is used as a resetting terminal of the GOA unit in the Nth stage. VDD is a high level signal and VSS is a low level signal. If a reverse scanning is performed, G(N+i) is used as the cascade inputting terminal of the GOA unit in the Nth stage, and G(N−i) is used as the resetting terminal of the GOA unit in the Nth stage. VDD is a low level signal and VSS is a high level signal.

The pulling-up circuit 2 may also include a capacitor C1. One electrode of C1 is coupled to the second node Q(N), and the other electrode of C1 is coupled to the gate voltage outputting terminal. Due to the bootstrap of the capacitor C1, the pulling-up circuit 2 can pull up the voltage at the second node Q(N).

The outputting circuit 3 may comprise a fourth transistor T4. The T4 has a gate coupled to the second node Q(N), a first electrode coupled to the clock signal terminal CLK, and a second electrode coupled to the gate voltage outputting terminal GOUT(N).

The reset controlling circuit 4 may comprise a sixth transistor T6 and a tenth transistor T10. The transistor T6 has a gate coupled to the DC signal inputting terminal GCH, a first electrode coupled to the second electrode of T11, and a second electrode coupled to the third node P(N). The transistor T10 has a gate coupled to the first node K(N), a first electrode coupled to the second electrode of T11, and a second electrode coupled to a low level voltage supplying terminal VGL.

The first resetting circuit 5 comprises a thirteenth transistor T13 and a fourteenth transistor T14. The transistor T13 has a gate coupled to the third node K(N), a first electrode coupled to the second node Q(N), and a second electrode coupled to the low voltage supplying terminal VGL. The transistor T14 has a gate coupled to the third node K(N), a first electrode coupled to the gate voltage outputting terminal GOUT(N), and a second electrode coupled to the low voltage supplying terminal VGL.

As shown in FIG. 4, transistors coupled to the DC signal inputting terminal in other circuits other than the pulling-up circuit may also be configured with at least two transistors.

For example, the reset controlling circuit 4 may include at least two transistors. Each of the at least two transistors is coupled to the DC signal inputting terminal GCH, and the at least two transistors are configured to be alternatively turned on under the control of the DC signal. For example, the transistor T6 and the transistor T7 may be respectively configured to be coupled to the GCH. T6 is an N-type transistor and T7 is a P-type transistor. Both the gate of T6 and the gate of T7 are coupled to the DC signal inputting terminal. The first electrode of T6 is coupled to the first electrode of T7, and the second electrode of T6 is coupled to the second electrode of T7. By controlling the voltage of the inputting signal of the DC signal inputting terminal GCH, one of the transistors can be in an ON state and the other transistor can be in an OFF state, so that the two transistors T6 and T7 can be controlled to operate in a time-sharing manner. That is, when T6 is in the ON state, T7 is in the OFF state, and when T7 is in the ON state, T6 is in the OFF state, which can reduce the time for which each transistor stays in the ON state and reduce the duration of each turning-on. This can not only improve the lifetime of the transistors, but also can effectively avoid the threshold voltage drift caused by a long time operation of the transistors.

In addition, the DC signal inputting terminal can also be divided into two square wave signals GCH1 and GCH2 with opposite phases. At least two transistors coupled to the DC signal inputting terminal which are in the pulling-up circuit 2 and the reset controlling circuit 4 are the same type of transistors. For example, T1 and T2 are N-type transistors, and T6 and T7 are N-type transistors. The gates of T1 and T6 are coupled to GCH1, and the gates of T2 and T7 are coupled to GCH2. Thus, at least two transistors coupled to the DC signal inputting terminal which are in the pulling-up circuit 2 and the reset controlling circuit 4 can be controlled to operate in a time-sharing manner, thereby reducing the time for which each transistor stays in the ON state and reducing the duration of each turning-on.

In the shift register unit according to the embodiments of the present disclosure, by configuring the transistors coupled with the DC signal inputting terminal which are in the pulling-up circuit 2 and the reset controlling circuit 4 as having at least two transistors, and enabling each of the at least two transistors to be turned on alternatively under the inputting signal of the DC signal inputting terminal, the lifetime of the transistors can be improved, thereby further improving the lifetime of the display panel. In addition, the threshold voltage drift caused by a long time operation of the transistors can be avoided, enhancing the stability of the thin film transistor devices.

Figure 5:
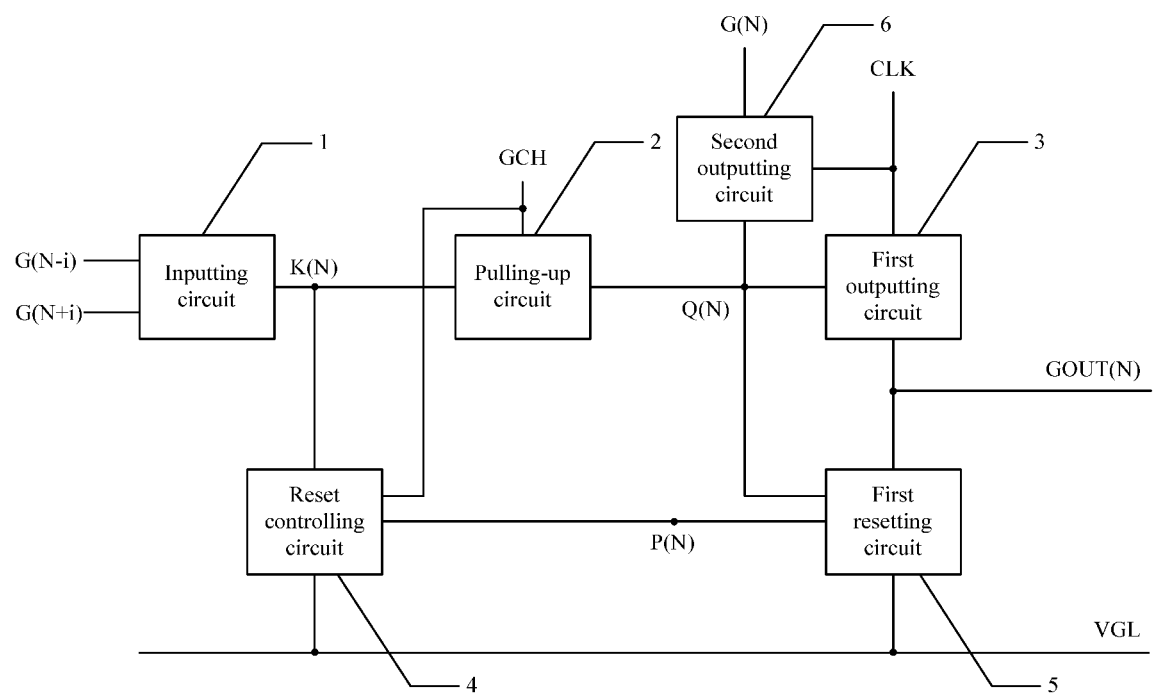
FIG. 5 shows a schematic structural diagram of still another shift register unit according to an embodiment of the present disclosure.

FIG. 5 shows a schematic structural diagram of still another shift register unit according to an embodiment of the present disclosure. Referring to FIG. 5, the shift register unit according to the embodiment of the present disclosure further includes a second outputting circuit 6.

The second outputting circuit 6 is coupled to the pulling-up circuit 2 and the first outputting circuit 3 via the second node Q(N), and is further coupled to the clock signal terminal CLK, and configured to output the clock signal to a cascade outputting terminal G(N) as a second outputting signal. The second outputting signal is used as a cascade inputting signal of the shift register unit in the next stage.

Figure 6:
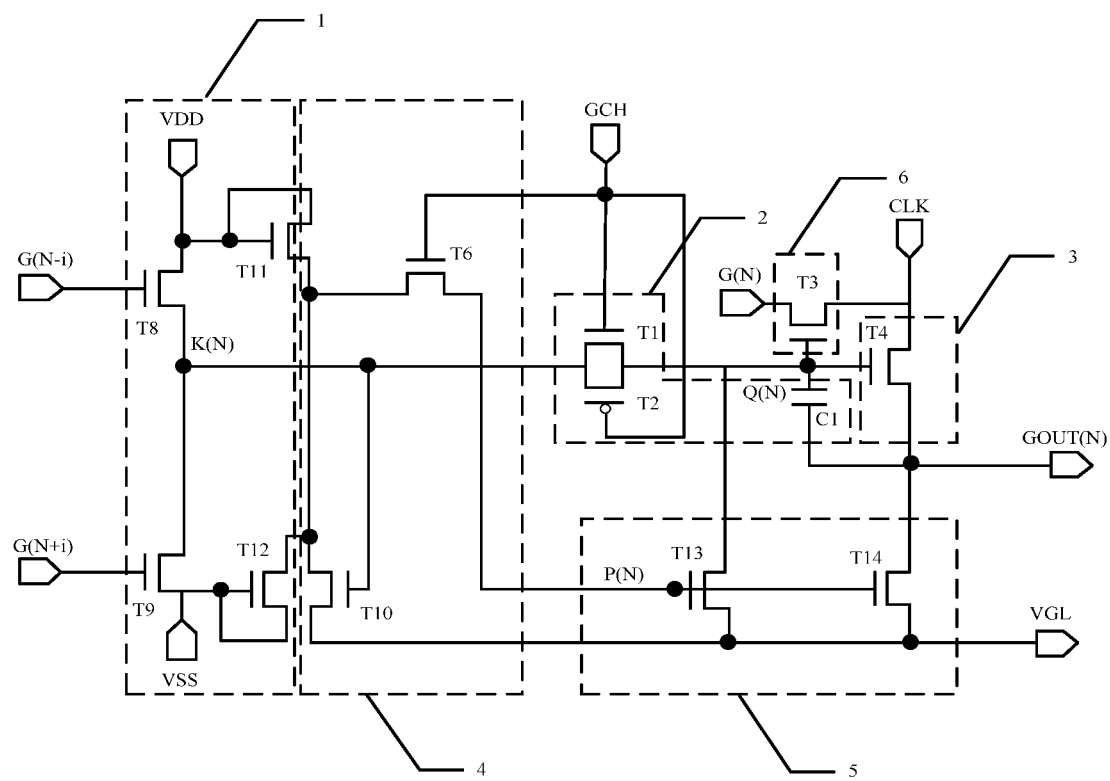
FIG. 6 shows a circuit diagram of the still another shift register unit according to the embodiment of the present disclosure.

Referring to FIG. 6, a circuit diagram of the still another shift register unit according to the embodiment of the present disclosure is shown. The second outputting circuit 6 comprises a third transistor T3; wherein the third transistor T3 has a gate coupled to the second node Q(N), a first electrode coupled to the clock signal terminal CLK, and a second electrode coupled to the cascade outputting terminal G(N). Therefore, when the second node Q(N) is at a high level, T3 is turned on so that the cascade outputting terminal G(N) outputs the clock signal and uses the clock signal as the second outputting signal, thereby separating the second outputting signal for the GOA cascade and the first outputting signal for turning on the corresponding gate line.

By providing the second outputting circuit 6, the second outputting signal for the GOA cascade and the first outputting signal for turning on the corresponding gate line can be separated, which can avoid the phenomena that there is no output from the shift register unit in the last stage caused by an overloaded active area. Thus, the second outputting signal for the GOA cascade can retain a sufficient voltage, even if the GOA unit is started in a low-temperature environment. It may further ensure the output used for the GOA cascade, thereby improving the capability of starting up in a low-temperature and making the GOA unit more stable.

Figure 7:
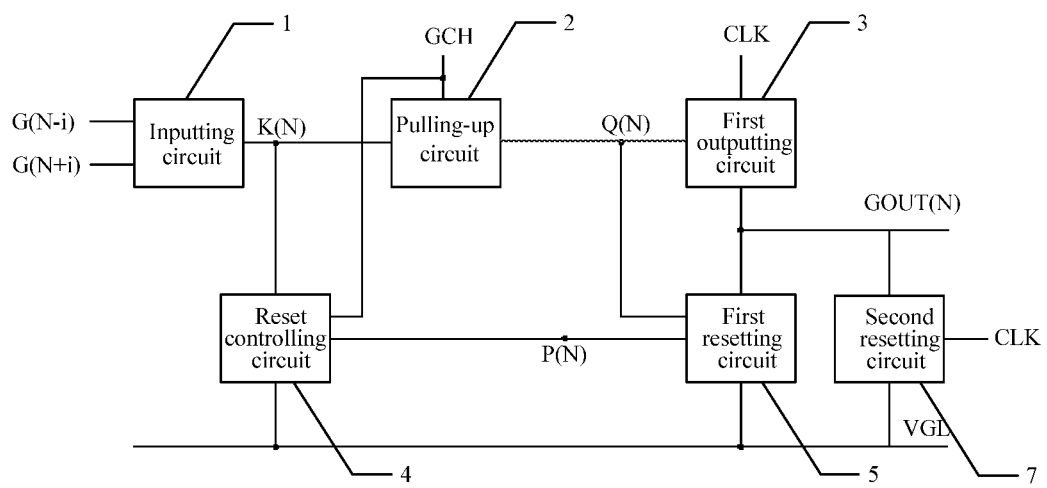
FIG. 7 shows a schematic structural diagram of yet another shift register unit according to an embodiment of the present disclosure.

Referring to FIG. 7, a schematic structural diagram of yet another shift register unit according to an embodiment of the present disclosure is shown. Referring to FIG. 7, it can be seen that the shift register unit according to the embodiment of the present disclosure further includes a second resetting circuit 7.

The second resetting circuit 7 is coupled to the gate voltage outputting terminal GOUT(N) and the low voltage supplying terminal VGL. The second resetting circuit 7 is configured to continuously reset the voltage at the gate voltage outputting terminal GOUT(N) under the control of the clock signal from the clock signal terminal CLK.

Figure 8:
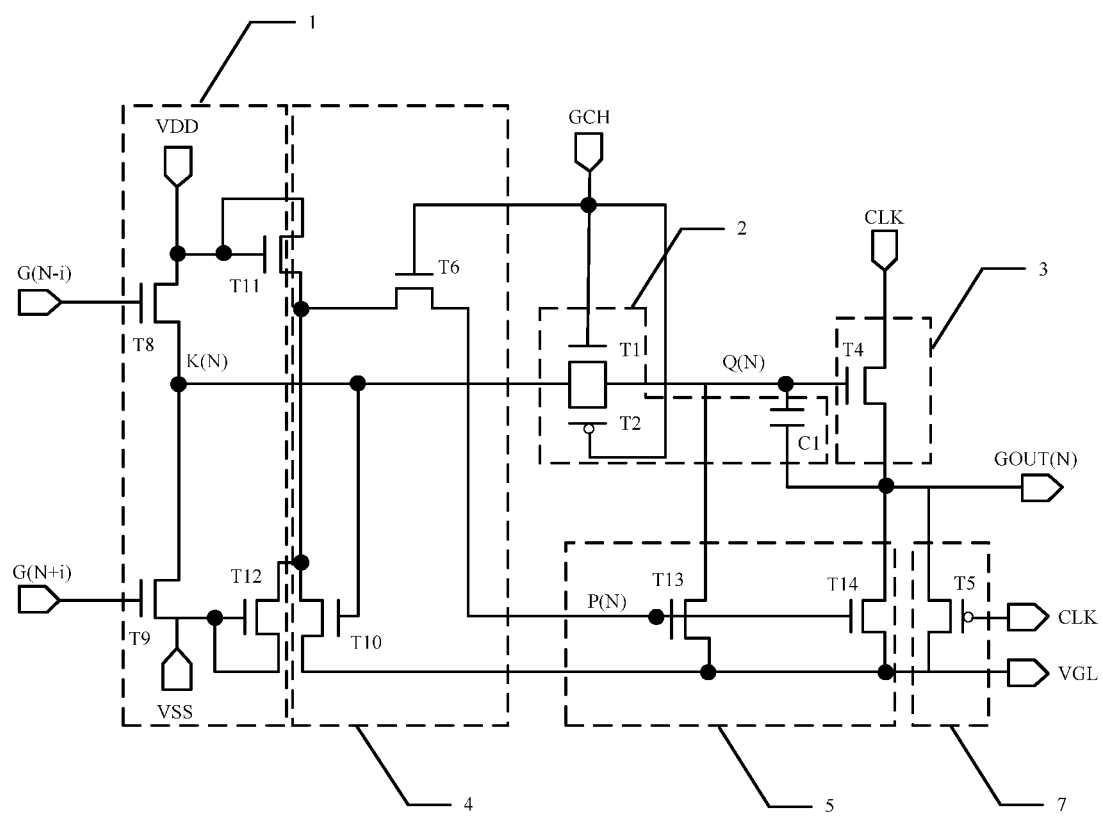
FIG. 8 shows a circuit diagram of the yet another shift register unit according to the embodiment of the present disclosure.

Referring to FIG. 8, a circuit diagram of the yet another shift register unit according to the embodiment of the present disclosure is shown. The second resetting circuit 7 includes a fifth transistor T5, and the first outputting circuit 3 includes a fourth transistor T4.

The transistor T4 is an N-type transistor and the transistor T5 is a P-type transistor. The transistor T4 has the gate coupled to the second node Q(N), the first electrode coupled to the clock signal terminal CLK, and the second electrode coupled to the gate voltage outputting terminal GOUT(N). The transistor T5 has the gate coupled to the clock signal terminal CLK, the first electrode coupled to the low voltage supplying terminal VGL, and the second electrode coupled to the gate voltage outputting terminal GOUT(N).

The transistors T4 and T5 can be alternatively turned on under the control of the clock signal from the clock signal terminal CLK. When T4 is in the OFF state, T5 is in the ON state, and when T5 is in the OFF state, T4 is in the ON state. This enables that the second resetting circuit 7 composed of the transistor T5 can continuously pull down the voltage at the GOUT (N) to the low voltage signal VGL when the first outputting circuit 3 composed of the transistor T4 is in the OFF state. That is, the second resetting circuit 7 may reset the voltage at the GOUT(N) continuously, thereby reducing the noise for the GOUT(N). Reducing the noise is to prevent crosstalk interference which may lead an error output from the GOUT(N), that is, to avoid the output of GOUT (N) from drifting, thereby improving the stability of the device.

Thus, in the embodiment of the present disclosure, by adding the second resetting circuit 7 to enable the first outputting circuit 3 to be in the non-operating state, GOUT (N) is continuously pulled down to the low-level signal VGL. That is, in addition to the operation time of the shift register unit, the second resetting circuit 7 can continuously reset GOUT(N), thereby continuously reducing the noise for GOUT(N), avoiding crosstalk and other factors, which further improve the stability of the GOA unit significantly.

When forming a gate driving circuit (a GOA circuit) is formed by using the above shift register units, a cascade inputting terminal of a shift register unit in a first stage is coupled to a frame starting signal terminal STV. The cascade inputting terminal of each of other shift register units other than the shift register unit in the first stage is coupled to a cascade outputting terminal G(N) of a shift register unit in its previous stage; and the resetting terminal of each of other shift register units other than the shift register unit in a last stage is coupled to a cascade outputting terminal G(N) of the shift register unit in its subsequent stage.

An embodiment of the present disclosure further provides a method for driving any one of the above-mentioned shift register unit. The method includes a pre-charging period a, a high level outputting period b, a low level outputting period c, and a resetting period d.

The at least two transistors coupled to the DC signal inputting terminal GCH of the pulling-up circuit 2 are turned on alternatively under the control of the DC signal from the DC signal inputting terminal GCH, during the pre-charging period a, the high level outputting period b, the low level outputting period c, and the resetting period d. In practice, the at least two transistors coupled to the DC signal inputting terminal GCH of the reset controlling circuit 4 may be also turned on alternatively under the control of the DC signal from the DC signal inputting terminal GCH.

Figure 9:
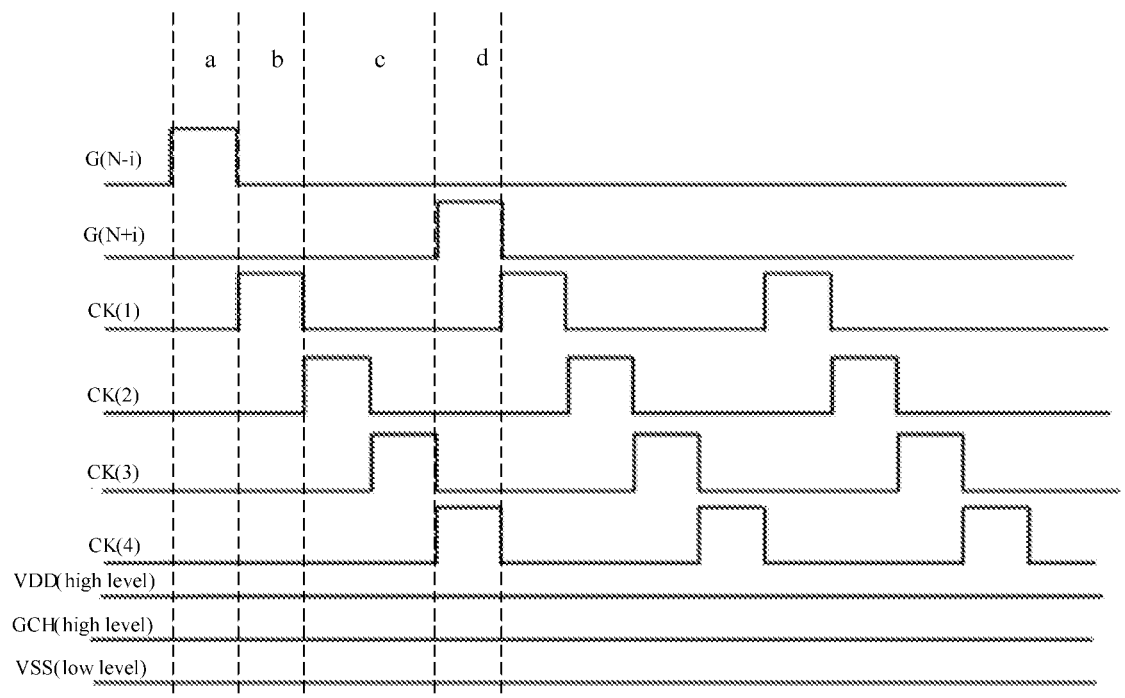
FIG. 9 shows a timing diagram of a circuit when a shift register unit is forward scanned according to an embodiment of the present disclosure.

For example, when a forward scanning is performed, the timing diagram of the above shift register unit is as shown in FIG. 9. In particular, the signals on the first to fourth clock signal lines CK1, CK2, CK3, and CK4 are square wave signals with the same frequency which are sequentially shifted by ¼ of cycle. Taking the clock signal input by the clock signal terminal CLK as CK1 for an example, the driving method may include the following steps.

During the pre-charging period a, the cascade inputting terminal G(N−i) and the first voltage supplying terminal VDD are at a high level. Thus, the inputting circuit 1 is turned on, and the first node K(N) is pulled up to a high level. The pulling-up circuit 2 is controlled by the inputting signal of the DC signal inputting terminal GCH to turn on the first transistor T1 and the second transistor T2 alternately. Thus, the second node Q(N) is pulled up to a high level.

During the high level outputting period b, the second node Q(N) maintains the high level under the control of the pulling-up circuit 2, and the clock signal input by the clock signal terminal CLK is at a high level. Thus, the first outputting circuit 3 is turned on, and outputs a high level to the gate voltage outputting terminal GOUT(N) under the control of the clock signal terminal CLK. The cascade outputting terminal G(N) is turned on, and a cascade outputting circuit 6 outputs a high level signal to the cascade outputting terminal G(N) under the control of the clock signal terminal CLK.

During the low level outputting period c, the clock signal input by the clock signal terminal CLK is at a low level. The second node Q(N) maintains a high level under the control of the pulling-up circuit 2, and the first outputting circuit 3 is turned on, and outputs a low level signal to the gate voltage outputting terminal GOUT(N) under the control of the clock signal terminal CLK. The cascade outputting terminal G(N) is turned on, and the cascade outputting circuit 6 outputs a low level signal to the cascade outputting terminal G(N) under the control of the clock signal CLK.

During the resetting period d, the resetting terminal G(N+i) is at the high level, and the second voltage supplying terminal VSS is at the low level. The first node K(N) is pulled down to the low level, and the reset controlling circuit 4 is turned off. The low voltage supplying terminal VGL pulls down the potential of the second node Q(N) to a lower level than the third node P(N). The first resetting circuit 5 is turned on, and resets the voltage at the second node Q(N) and the voltage at the gate voltage outputting terminal GOUT(N).

For the shift register unit comprising the second resetting circuit 7, the periods other than the high level outputting period b are continuous resetting periods. That is, periods a, b and c are continuous resetting periods. In the continuous reset periods, the clock signal input from the clock signal terminal CLK is at a low level, so as to enable the second resetting circuit 7 comprising a P-type transistor to reset the voltage at the gate voltage outputting terminal GOUT(N) continuously.

An embodiment of the present disclosure further provides a display panel comprising the above gate driving circuit. The display panel can be any product or component with display function such as an electronic paper, a mobile phone, a tablet, a television, a notebook, a digital photo frame, a navigator, and the like.

It should be noted that any of the foregoing circuits is an example of a shift register unit according to the embodiments of the present disclosure. Those skilled in the art can also obtain the inputting circuit, the pulling-up circuit, the first outputting circuit, the cascade outputting circuit, the reset controlling circuit, the first resetting circuit, and the second resetting circuit of other structures on the basis of the above description, as long as the related circuit can be realized.

Each embodiment in this specification is described in a progressive manner, and each embodiment focuses on the differences from other embodiments, and the same or similar parts among the embodiments can be referred to each other.

The above description shows a shift register unit and a driving method thereof, a gate driving circuit, and a display panel according to the embodiments of the present disclosure. Those skilled in the art can understand that the above description is only used to help understanding the embodiments of the present disclosure, and the specific implementation manners and application scopes of the embodiments of the present disclosure can be modified within the scope defined by the appended claims. The contents of the description should not be construed as limiting the embodiments of the present disclosure.

We claim:
1. A shift register unit, comprising:
an inputting circuit, coupled to a cascade inputting terminal for receiving an inputting signal and a first node, and configured to pull-up or pull-down a voltage at the first node under control of the inputting signal;
a first outputting circuit, coupled to a clock signal terminal for providing a clock signal and a second node, and configured to output the clock signal as a first outputting signal at a gate voltage outputting terminal under control of the clock signal;
a reset controlling circuit, coupled to a third node and a first level supplying terminal for providing a first level signal, and configured to control an operation of a first resetting circuit;
the first resetting circuit, coupled to the second node, the gate voltage outputting terminal and the first level supplying terminal, and configured to reset a voltage at the second node and a voltage at the gate voltage outputting terminal under control of the reset controlling circuit; and
a pulling-up circuit comprising at least two transistors, wherein each of the at least two transistors is coupled to a DC signal inputting terminal for providing a DC signal,
wherein the at least two transistors are configured to be alternatively turned on under control of the DC signal, so as to pull up the voltage at the second node.

2. The shift register unit of claim 1, wherein the pulling-up circuit comprises a first transistor and a second transistor, wherein the first transistor is an N-type transistor and the second transistor is a P-type transistor;
wherein a gate of the first transistor and a gate of the second transistor are coupled to the DC signal inputting terminal; and
wherein the first transistor has a first electrode coupled to a first electrode of the second transistor, and a second electrode coupled to a second electrode of the second transistor.

3. The shift register unit of claim 1, wherein:

the reset controlling circuit comprises at least two transistors, wherein each of the at least two transistors is coupled to the DC signal inputting terminal, and the at least two transistors are configured to be alternatively turned on under control of the DC signal.

4. The shift register unit of claim 1, further comprising a second outputting circuit, wherein the second outputting circuit is coupled to the pulling-up circuit and the first outputting circuit via the second node, and is further coupled to the clock signal terminal, and is configured to output the clock signal to a cascade outputting terminal as a second outputting signal.

5. The shift register unit of claim 4, wherein the second outputting circuit comprises a third transistor;

wherein the third transistor has a gate coupled to the second node, a first electrode coupled to the clock signal terminal, and a second electrode coupled to the cascade outputting terminal.

6. The shift register unit of claim 1, further comprising a second resetting circuit, wherein the second resetting circuit is coupled to the gate voltage outputting terminal and the first level supplying terminal, and is configured to reset the voltage at the gate voltage outputting terminal under control of the clock signal.

7. The shift register unit of claim 6, wherein the second resetting circuit comprises a fifth transistor, and wherein the first outputting circuit comprises a fourth transistor; wherein one of the fourth and fifth transistors is an N-type transistor and the other is a P-type transistor;

wherein the fourth transistor has a gate coupled to the second node, a first electrode coupled to the clock signal terminal, and a second electrode coupled to the gate voltage outputting terminal; and wherein the fifth transistor has a gate coupled to the clock signal terminal, a first electrode coupled to the first level supplying terminal, and a second electrode coupled to the gate voltage outputting terminal.

8. A gate driving circuit comprising a plurality of cascaded shift register units of claim 1, wherein:

the cascade inputting terminal of a first stage shift register unit is coupled to a frame starting signal terminal;

wherein the cascade inputting terminal of each shift register unit other than the the first stage shift register unit is coupled to a cascade outputting terminal of a previous stage shift register unit; and wherein the resetting terminal of each shift register unit other than a last stage shift register unit is coupled to a cascade outputting terminal of a subsequent stage shift register unit.

9. A method for driving the shift register unit of claim 1, comprising:

a pre-charging period;

a high level outputting period;

a low level outputting period; and a resetting period, wherein the at least two transistors coupled to the DC signal inputting terminal of the pulling-up circuit are turned on alternatively under control of the DC signal from the DC signal inputting terminal during the pre-charging period, the high level outputting period, the low level outputting period, and the resetting period.

10. The driving method of claim 9, wherein:

during the high level outputting period, the second node is maintained at a high level due to the pulling-up circuit, and the clock signal is at a high level;

the first outputting circuit outputs the first outputting signal of a high power to the gate voltage outputting terminal under control of the clock signal; and the second outputting circuit outputs the second outputting signal of a high power to the cascade outputting terminal under control of the clock signal.

11. The driving method of claim 9, wherein the periods other than the high level outputting period are continuous resetting periods; and wherein in the continuous resetting periods, the clock signal is at a low level, so as to enable the second resetting circuit to reset the voltage at the first outputting terminal continuously.

12. A display panel comprising the gate driving circuit of claim 8.

* * * * *